(12) United States Patent
Ha

(10) Patent No.: US 6,781,914 B2
(45) Date of Patent: Aug. 24, 2004

(54) FLASH MEMORY HAVING A FLEXIBLE BANK PARTITION

(75) Inventor: Chang Wan Ha, Pleasanton, CA (US)

(73) Assignee: Winbond Electronics Corp., San Jose, CA (US)

( * ) Notice: Subject to any disclaimer, the term of this patent is extended or adjusted under 35 U.S.C. 154(b) by 0 days.

(21) Appl. No.: 09/938,410

(22) Filed: Aug. 23, 2001

(65) Prior Publication Data

US 2003/0039140 A1 Feb. 27, 2003

(51) Int. Cl.[7] .................................................. G11C 7/00
(52) U.S. Cl. ................ 365/230.03; 365/63; 365/189.04
(58) Field of Search ............................. 365/230.03, 63, 365/189.04, 185.11, 185.33, 185.01

(56) References Cited

U.S. PATENT DOCUMENTS

| | | | |
|---|---|---|---|
| 5,245,572 A | 9/1993 | Kosonocky et al. | |
| 5,410,680 A | * | 4/1995 | Challa et al. ................. 703/24 |
| 5,841,696 A | | 11/1998 | Chen et al. |
| 5,847,998 A | | 12/1998 | Van Buskirk |
| 5,867,430 A | | 2/1999 | Chen et al. |
| 5,995,415 A | | 11/1999 | Kuo et al. |
| 6,005,803 A | | 12/1999 | Kuo et al. |
| 6,016,270 A | | 1/2000 | Thummalapally et al. |
| 6,033,955 A | | 3/2000 | Kuo et al. |
| 6,088,264 A | | 7/2000 | Hazen et al. |
| 6,088,287 A | | 7/2000 | Bill et al. |
| 6,535,426 B2 | * | 3/2003 | Michael et al. ........... 365/185.2 |
| 6,614,685 B2 | * | 9/2003 | Wong .................... 365/185.11 |

* cited by examiner

*Primary Examiner*—Hoai Ho
(74) *Attorney, Agent, or Firm*—Townsend and Townsend and Crew LLP

(57) ABSTRACT

A simultaneous operation flash memory chip architecture having a flexible memory bank partition for forming first and second memory banks from a plurality of flash memory arrays, said partition being defined by selecting one of a plurality of preformed metal masks, which allows the formation and extension of pre-decoded address lines to inputs of decoders associated with the first and second memory banks, respectively.

17 Claims, 5 Drawing Sheets

| Mask | First Bank | Second Bank |
|---|---|---|
| Mask #1 | 4 Mb | 28 Mb |
| Mask #2 | 8 Mb | 24 Mb |
| Mask #3 | 12 Mb | 20 Mb |
| Mask #4 | 16 Mb | 16 Mb |
| Mask #5 | 20 Mb | 12 Mb |
| Mask #6 | 24 Mb | 8 Mb |
| Mask #7 | 28 Mb | 4 Mb |

*FIG. 3*

FLASH MEMORY HAVING A FLEXIBLE BANK PARTITION

BACKGROUND OF THE INVENTION

The present invention relates to flash memories. More particularly, the present invention relates to simultaneous operation flash memory chip architectures having flexible bank partitions.

Electronic systems often include a processor and memory. The memory in these electronic systems stores program instructions for the processor (i.e. code) and data. In many systems the code and/or data must be retained when power to the system is withdrawn. A type of memory that performs this retaining function is known as non-volatile memory. Some electronic devices, which use non-volatile memory, include personal computers, personal digital assistants, cellular telephones and digital cameras. For examples, a cellular telephone uses non-volatile memory to store telephone numbers and a personal computer uses non-volatile memory to store the computer's BIOS (basic input/output system).

There are a variety of non-volatile memory types. One commonly used type is flash memory. Flash memory devices have a memory array of flash transistors configured in rows and columns. A wordline decoder (also referred to as an X-decoder) provides operational voltages to rows of transistors within pre-defined sectors of the memory array. The wordline decoder is typically connected to the gates of the flash transistors within a given sector. A bit line decoder (also referred to as a Y-decoder) provides operational voltages to columns of transistors and is typically connected to the drains of the flash transistors within each column. Usually, the sources of all the flash transistors are coupled to a common sourceline, which is controlled by a sourceline controller.

A limitation of the conventional flash memory described above relates to the differences in time it takes to perform a read operation compared to the time it takes to perform either a program operation or an erase operation. Program and erase cycles for typical flash memory devices are much longer than read access times. This disparity limits the speed of operation of systems in which such a memory is used.

To overcome this problem, a modified flash memory device, known as a simultaneous operation flash memory device, has been developed. In a typical simultaneous operation flash memory device, the flash memory array is partitioned into an upper memory bank and a lower memory bank. The upper and lower memory banks are normally used for different purposes. For example, the upper memory bank may be used for code storage, whereas the lower memory bank may be used for data storage. Although the simultaneous operation flash memory device is an improvement, it has a limitation of its own in that the partitioning of the upper and lower banks is fixed in the design. Such memory devices are, therefore, limited to applications that are compatible with the fixed memory partition.

To overcome the rigidity of the fixed memory partition scheme, U.S. Pat. No. 5,995,415 to Kuo et al. proposes a flash memory device having a flexible bank partition architecture. In this patent, Kuo et al. teach how bit lines of a memory array can be flexibly partitioned to form upper and lower memory banks. Because the bit lines of the memory array are split to make the partition, however, an additional column decoder (i.e. y-decoder) is required to implement the design. This not only renders the design more complex, it also limits the area available for forming the memory array portion of the flash memory device.

SUMMARY OF THE INVENTION

Generally, a simultaneous operation flash memory chip architecture having a flexible memory bank partition for forming first and second memory banks from a plurality of flash memory arrays and a method of forming the same are disclosed. The partition is defined by selecting one of a plurality of preformed metal masks, which allows the formation and extension of pre-decoded address lines to inputs of decoders associated with the first and second memory banks, respectively.

According to an aspect of the invention a method of forming a simultaneous operation dual-bank flash memory device comprises steps of providing a plurality of flash memory arrays, providing row and column decoders for each flash memory array and partitioning the plurality of flash memory arrays into a first memory bank and a second memory bank by coupling first bank row and column address lines between first bank row and column pre-decoders and the row and column decoders associated with the first memory bank, and by coupling second bank row and column address lines between second bank row and column pre-decoders and the row and column decoders associated with the second memory bank.

According to another aspect of the invention, a method of forming a dual-bank flash memory device comprises steps of: providing a plurality of flash memory arrays, each memory array having associated row and column address decoders and partitioning the flash memory arrays into a first memory bank and a second memory bank. Partitioning the flash memory arrays into first and second memory banks is accomplished by forming first bank pre-decoded column address lines and coupling them between a first bank column address pre-decoder and the column address decoders associated with the first bank, forming second bank pre-decoded column address lines and coupling them between a second bank column address pre-decoder and the column address decoders associated with the second bank, forming first bank pre-decoded row address lines and coupling them between a first bank row address pre-decoder and the row address decoders associated with the first bank, and forming second bank pre-decoded row address lines and coupling them between a second bank row address pre-decoder and the row address decoders associated with the second bank. According to this aspect of the invention, the sizes of the first and second memory banks are variable, depending upon selection from and application of one a plurality of preformed metal masks used to perform the step of partitioning.

According to another aspect of the invention, a simultaneous operation flash memory device having a flexible dual-bank architecture comprises a plurality of memory arrays capable of being partitioned into a first memory bank and a second memory bank. The partitioning of arrays within the first and second memory banks is determined by how pre-decoded row and address lines are formed during a process used to fabricate the device.

According to yet another embodiment of the present invention, a simultaneous operation flash memory chip having a flexible memory bank partition comprises a plurality of memory arrays having associated row and column decoders, said plurality of memory arrays partitioned into first and second memory banks, a first bank column address pre-decoder coupled to the column address decoders associated with the first memory bank, a first bank row address pre-decoder coupled to the row address decoders associated with the first memory bank, a second bank column address pre-decoder coupled to the column address decoders associated with the second memory bank, and a second bank row address pre-decoder coupled to the row address decoders associated with the second memory bank.

A further understanding of the nature and the advantages of the inventions disclosed herein is described now in reference to the remaining portions of the specification and the attached drawings.

BRIEF DESCRIPTION OF THE DRAWINGS

FIG. 3 shows first and second bank partition sizes for an 8×4 Mb flash memory device, according to an embodiment of the present invention.

DETAILED DESCRIPTION OF THE INVENTION

Figure 1A:
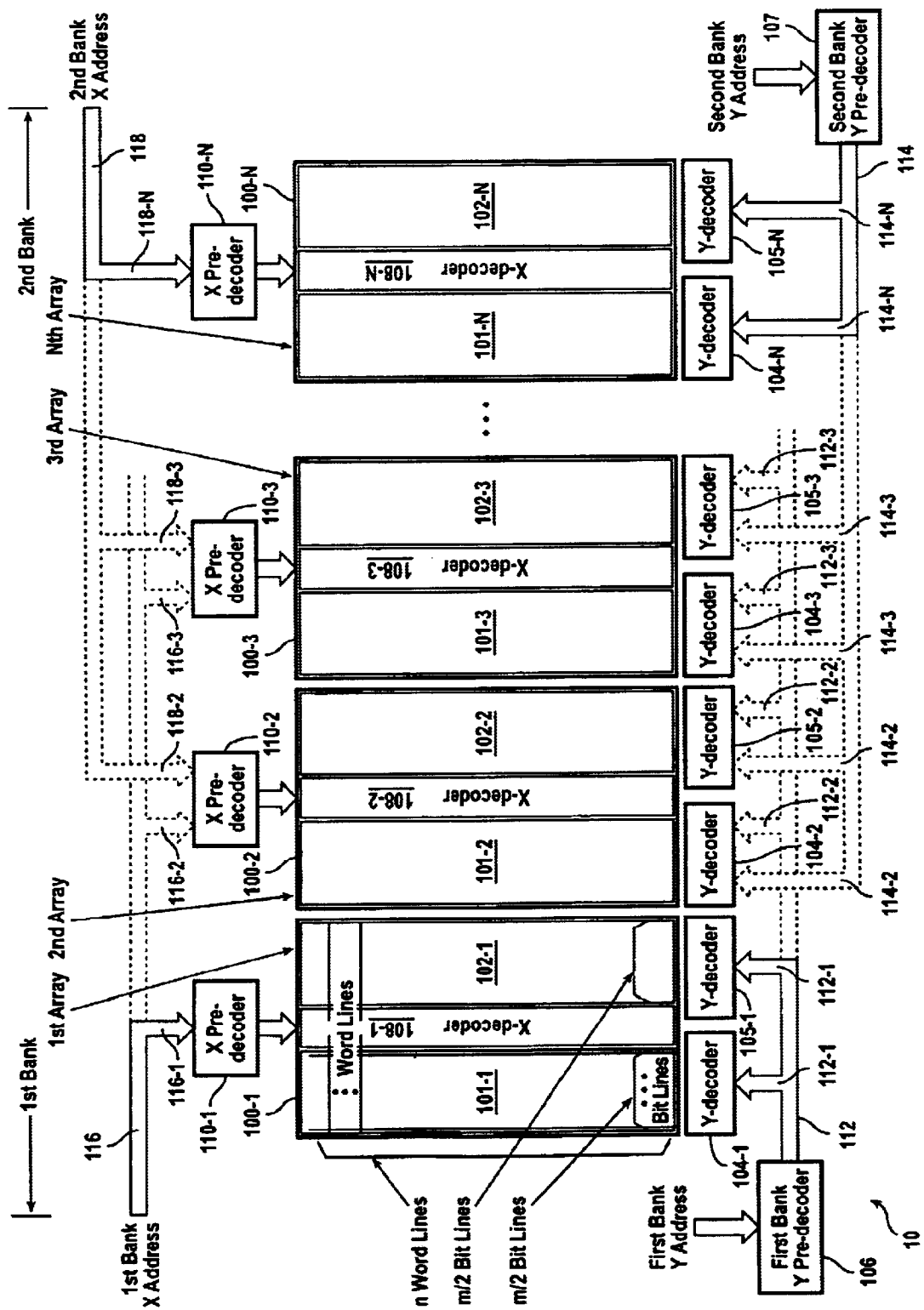
FIG. 1A shows a simultaneous operation flash memory device, including a flexible bank partition, according to an embodiment of the present invention.

FIG. 1A shows a simultaneous operation flash memory device 10, including a flexible bank partition, according to an embodiment of the present invention. Flash memory device 10 comprises a plurality of (m×n)=(row×column) memory arrays 100-1 through 100-N. Memory arrays 100-1 through 100-N are split into left halves 101-1 through 101-N and right halves 102-1 through 102-N.

Figure 1B:
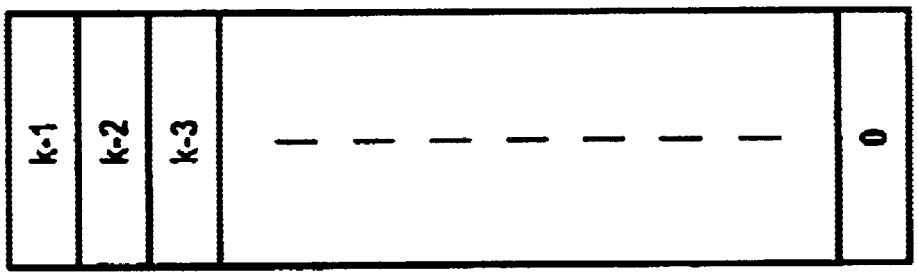
FIG. 1B shows how each of N arrays, such as the N arrays shown in FIG. 1A, may be divided into k sectors.
Figure 1B:
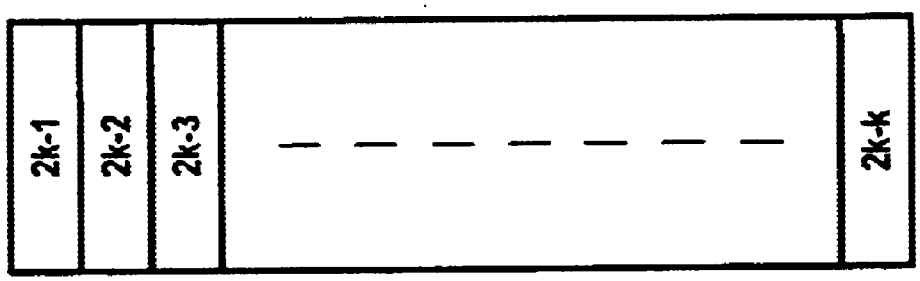
Figure 1B:
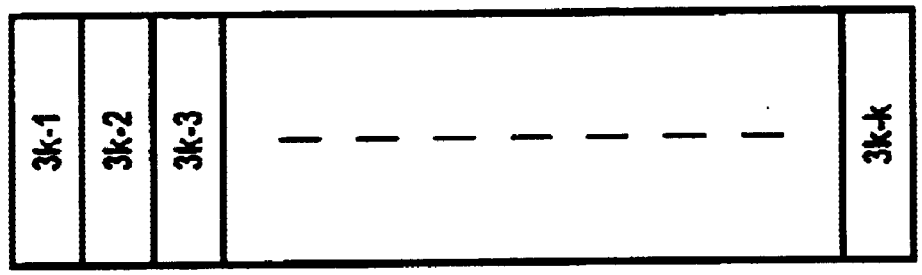
Figure 1B:
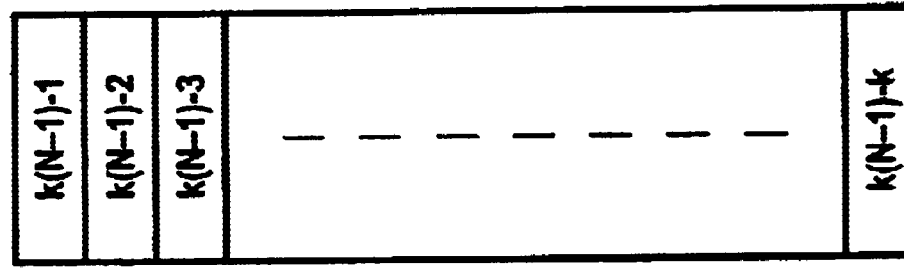
Figure 1B:
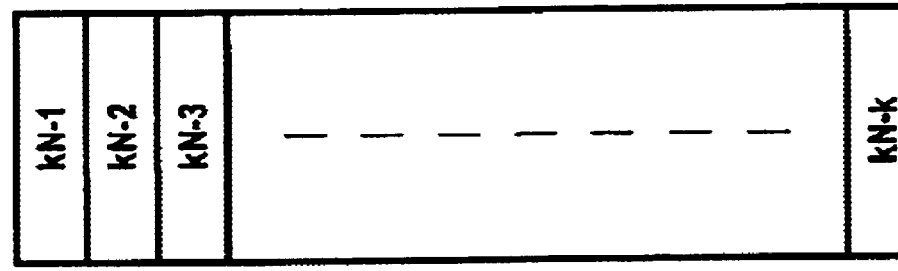

Each of memory arrays 100-1 through 100-N may be expressed and divided into a predefined number of sectors. For example, FIG. 1B shows how each of N arrays, such as the N arrays shown in FIG. 1A, may be divided into k sectors. With k sectors/array, the number of addresses required to define the starting address of each sector is $\log_2[k(N)]$. Each sector of an array may be further divided into a predefined number of basic data input/output words. Accordingly, if the basic data input/output word length of memory device 10 is z bits long, then $\log_2(n/z)$ bit address lines and $\log_2(n/k)$ word address lines are required to address the start of each word in the array.

Referring again to FIG. 1A, left halves 101-1 through 101-N and corresponding right halves 102-1 through 102-N, of each of memory arrays 100-1 through 100-N, contain Y-decoders 104-1 through 104-N and 105-1 through 105-N, which decode pre-decoded address information for left halves 101-1 through 101-N and right halves 102-1 through 102-N of memory arrays 100-1 through 100-N. Y-decoders 104-1 through 104-N and 105-1 through 105-N are selectively configured to accept and decode pre-decoded bit line addresses provided by first bank Y pre-decoder 106 and second bank Y pre-decoder 107, depending on which one of a plurality of metal masks is chosen to form the input lines to Y-decoders 104-1 through 104-N and 105-1 through 105-N. This aspect of the invention is described in more detail below.

Left halves 101-1 through 101-N and corresponding right halves 102-1 through 102-N of each of memory arrays 100-1 through 100-N also contain X-decoders 1081 through 108-N, respectively. X-decoders 108-1 through 108-N are configured to decode pre-decoded word line addresses provided to selected ones of X pre-decoders 110-1 through 110-N, again depending on which one of a plurality of metal masks is chosen to form the input lines to X decoders 108-1 through 108-N.

The dashed input lines to the Y-decoders between Y-decoders 104-1 through 104-N and between Y-decoders 105-1 through 105-N and the dashed input lines to the X pre-decoders between X pre-decoders 110-1 through 110-N, illustrate the flexible bank partition architecture, according to an embodiment of the present invention. Memory array 100-1 comprises the minimum size of a first memory bank and memory array 100-N comprises the minimum size of second bank memory size. Selection of the minimum first memory bank size is represented in FIG. 1A by solid arrows 112-1 of pre-decoded first bank Y address lines 112 coupled between first bank Y pre-decoder 106 and Y-decoders 104-1 and 105-1 and by the solid arrow 116-1 of first bank X address 116, which is coupled to X pre-decoder 110-1. Similarly, selection of the minimum second memory bank size is represented in FIG. 1A by solid arrows 114-N of pre-decoded second bank Y address lines 114 coupled between second bank Y pre-decoder 107 and Y-decoders 104-N and 105-N and by the solid arrow 118-N of the second bank X address 118, which is coupled to X pre-decoder 110-N.

While the minimum possible sizes for both the first and second memory banks have been described, in practice a flexible partition is selected to define and divide the entirety of memory arrays 100-1 through 100-N between the first memory bank and the second memory bank. So, for example, if the first memory bank has the minimum size comprising memory array 100-1, the second memory bank would comprise memory arrays 100-2 through 100-N.

According to an embodiment of the present invention, the distribution of memory of flash memory device 10 between the first and second memory banks is variable. In other words, the memory bank partition, defining the division between the first and second banks, is "flexible". As mentioned above, the partition between the first and second banks is varied by selecting and applying a different metal mask during the step in the manufacturing process in which the pre-decoded Y address lines 112 and 114 and first and second bank X address lines 116 and 118 are formed. The mask is selected from a plurality of preformed masks, wherein each mask differs from another by the how pre-decoded first and second Y address lines 112 and 114 are coupled to the Y-decoders (104-1 through 104-N and 105-1 through 105-N) of memory arrays 100-1 through 100-N and how first and second bank X addresses 116 and 118 are coupled to X pre-decoders 110-1 through 110-N of memory arrays 100-1 through 100-N. By being able to select from among the plurality of masks, a flexible bank partition is realized. The metal masks can be formed using conventional techniques, which are described, for example, in "Silicon Processing for the VLSI Era, Volume I, Process Technology," by S. Wolf and R. N. Tauber, Lattice Press (1986), which is incorporated into this disclosure by reference.

As explained above, the flexibility in partitioning the first and second memory banks is illustrated in FIG. 1A by the dashed arrows from first bank Y pre-decoder 106 to other Y-decoders, in addition to Y-decoders 104-1 and 105-1; by the dashed arrows from second bank Y pre-decoder 107 to other Y-decoders, in addition to Y-decoders 104-N and 105-N; by the dashed arrows of first bank X address 116 to other X pre-decoders, in addition to X pre-decoder 110-1;

and by the dashed arrows of second bank X address 118 to other X pre-decoders, in addition to X pre-decoder 110-N. So, for example, if a partition is desired such that the first memory bank comprises the first two memory arrays 110-1 and 110-2 and the second memory bank comprises the remaining arrays 110-3 through 110-N, a preformed metal mask would be applied, which would: allow the first bank pre-decoded Y address lines 112 to be extended and coupled to Y-decoders 104-2 and 105-2 (as shown by arrows 112-2); allow the second bank pre-decoded Y address lines 114 to be extended and coupled to Y-decoders 104-3 and 105-3 (as shown by arrows 114-3) and to the other Y-decoders for the arrays in between arrays 100-N and 100-3; allow the first bank X address lines 116 to be extended and coupled to X pre-decoder 110-2; and allow the second bank address lines 118 to be extended and coupled to X pre-decoder 110-3 and to the other X pre-decoders for the arrays in between arrays 100-N and 100-3.

Figure 2A:
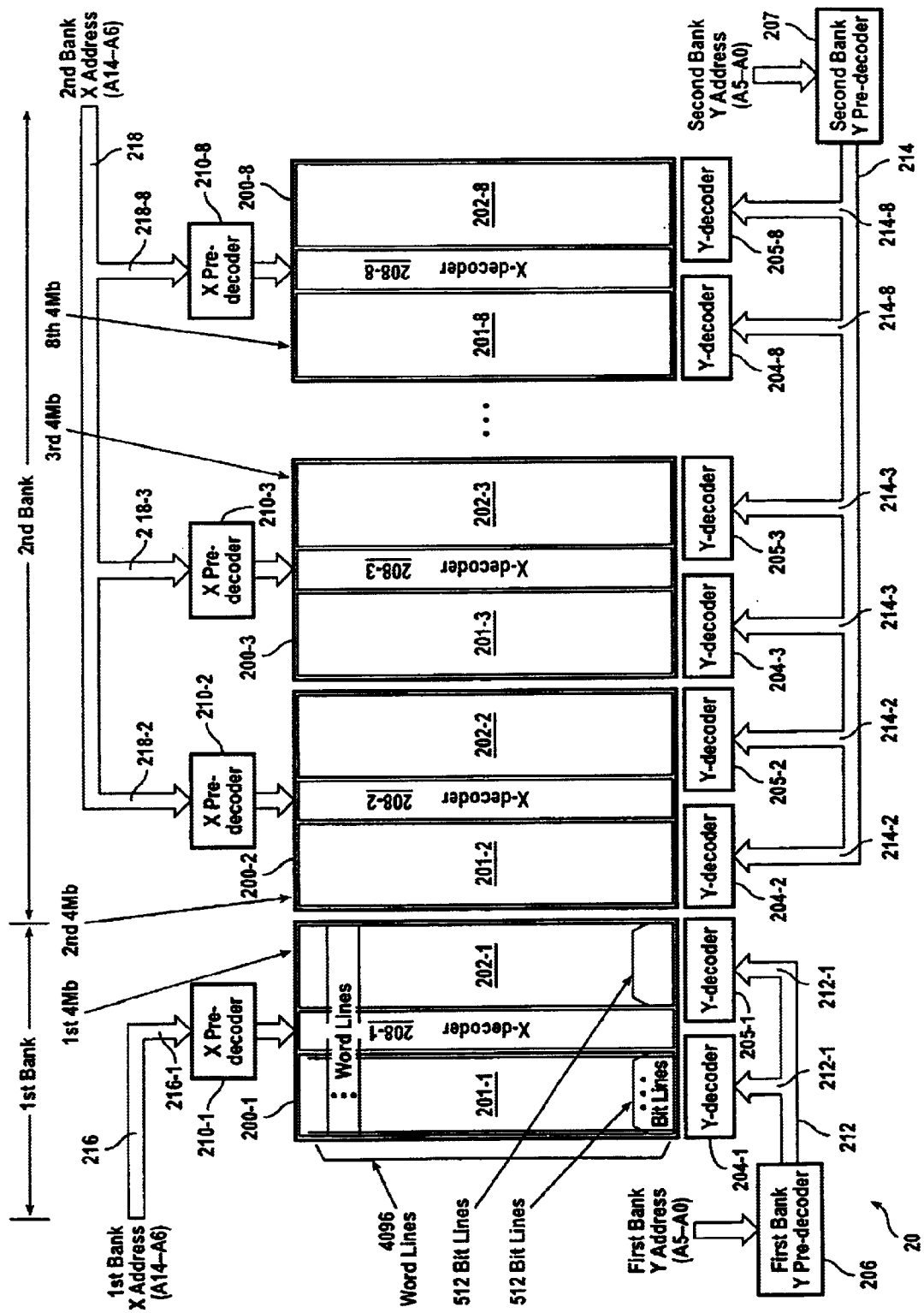
FIG. 2A shows an example of a simultaneous operation 8×4 Mb flash memory device, according to an embodiment of the present invention, wherein a specific metal mask has been selected form a number of preformed masks and applied to form a 4 Mb first bank and a 28 Mb second bank.

Referring now to FIG. 2A, there is shown a simultaneous operation 8×4 Mb flash memory device 20, which illustrates a specific exemplary bank partition, according to an embodiment of the present invention. In this example, a specific preformed metal mask has been selected and applied to form a 4 Mb first bank and a 28 Mb second bank. And, there are eight 4 Mb arrays 200-1 through 200-8. Memory arrays 200-1 through 200-8 are split into left halves 201-1 through 201-8 and right halves 202-1 through 202-8.

Figure 2B:
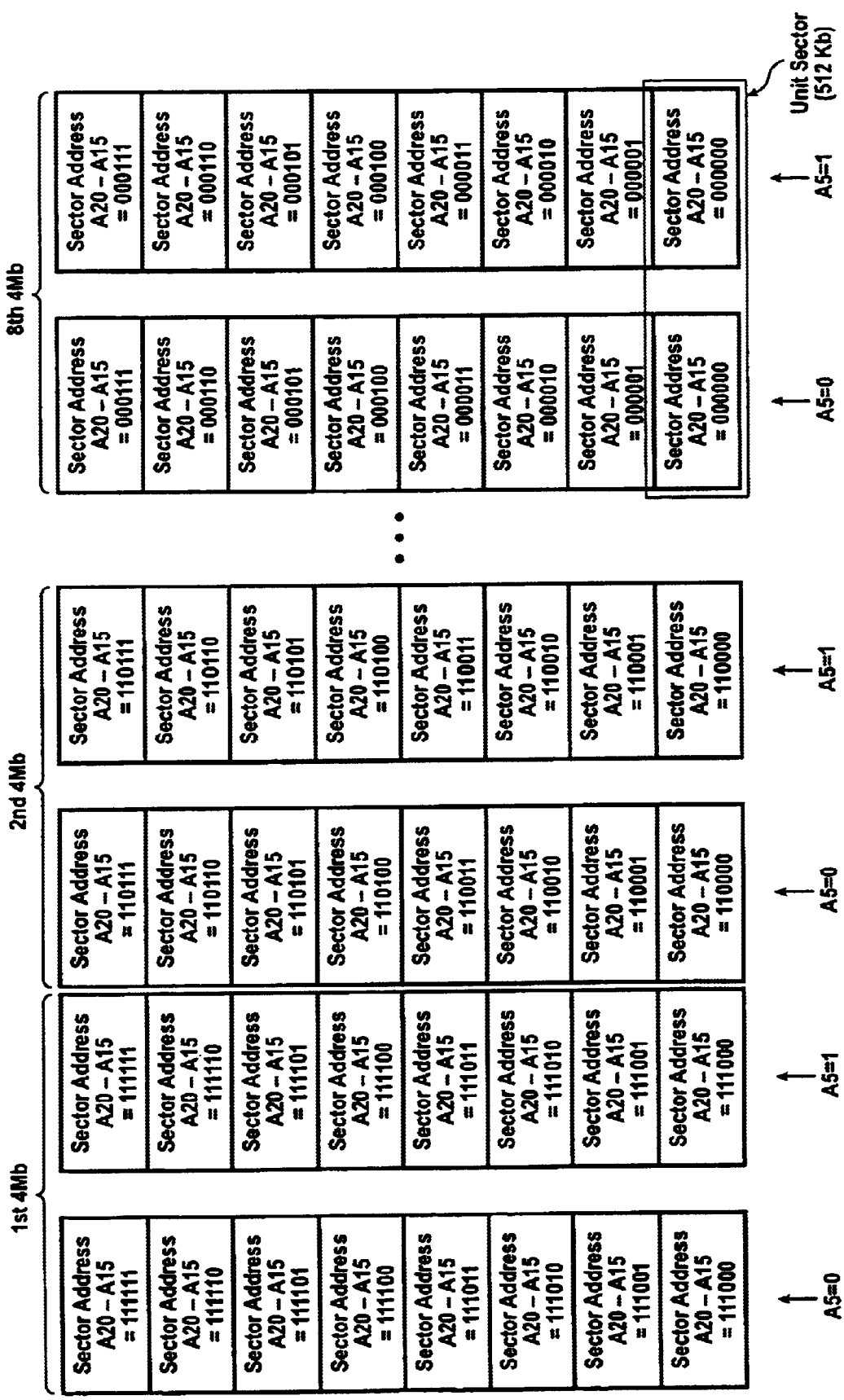
FIG. 2B shows a sector address memory map of the flash memory device shown in FIG. 2A.

Each of memory arrays 200-1 through 200-8 is divided into eight sectors as shown in FIG. 2B. With eight sectors per array, there are $\log_2[k(N)]=\log_2(64)=6$ address lines, which address the starting addresses of the sixty-four sectors. In this example, and as shown in the sector address memory map in FIG. 2B, address lines A15 through A20 are used for this purpose. Also shown in FIG. 2B is how address line A5 is used to select between left halves 201-1 through 201-8 and right halves 202-1 through 201-8 of the selected one of memory arrays 200-1 through 200-8.

Each sector of arrays 200-1 through 200-N is further divided into a predefined number of basic data input/output words, which in this example are words having a 16-bit length. Accordingly, $\log_2(n/z)=\log_2(1024/16)=6$ bit address lines (shown as A0–A5 in FIG. 2A) and $\log_2(4096/8)=9$ word address lines (shown as A6–A14 in FIG. 2A) are used to address the words within a selected sector.

In the example provided in FIG. 2A, a preformed metal mask is selected so that the size of the first bank is 4 Mb while the size of the second bank is 28 Mb. The 4 Mb/28 Mb partition is determined by the selected metal mask, which allows but limits formation and extension of first bank pre-decoded Y address lines 212 between first bank Y pre-decoder 206 and Y-decoders 204-1 and 205-1 (as shown by arrows 212-1) and which allows but limits formation and extension of first bank X address lines 216 to X pre-decoder 210-1 (as shown by arrow 216-1). The 28 Mb second bank is also determined by the selected mask, which allows but limits formation and extension of second bank pre-decoded Y address lines 214 between second bank Y pre-decoder 207 and Y-decoders 204-2 through 204-8 and 205-2 through 205-8 (as shown by arrows 214-2 through 214-8) and which allows but limits formation and extension of second bank X address lines 218 to X pre-decoders 210-2 through 210-8 (as shown by arrows 218-2 through 218-8).

For the 8×4 Mb array example discussed above, other partitions defining the size of the first and second banks are possible, according to the flexible bank partitioning aspect of the present invention. According to the exemplary 8×4 Mb array described above, there are seven possible bank partitions, each of which is realized by selecting from one of seven preformed metal masks, which will allow the partition to be achieved. This is shown in FIG. 3, where it is seen that Mask #1 would be chosen to form the 4 Mb/28 Mb partition shown in FIG. 2A. Mask #'s 2–7 could be selected and used to form and extend the address lines to the appropriate X pre-decoders and Y decoders, to form the other bank partitions in the manner described above.

While the above is a complete description of the preferred embodiments of the invention, various alternatives, modifications, and equivalents may be used. For example, whereas flexibility in partitioning has been described as being achieved by the selection from a plurality of preformed masks, the meaning of the word "masks," as used in this disclosure is intended to encompass, not just photomasks, but other pattern generating means as well. For example, reticules using steppers might also be used. Additionally, whereas the memory arrays of the preferred embodiments have been described as being split, in an alternative embodiment the arrays could be undivided, and to such undivided arrays the partitioning aspect of the present invention could be applied. For these and other reasons, therefore, the above description should not be taken as limiting the scope of the invention, which is defined by the appended claims.

What is claimed is:

1. An integrated circuit memory comprising:
a plurality of memory arrays partitioned into first and second memory banks in correspondence with one of a plurality of mask options such that the length of a plurality of bit lines in each of the first and second memory banks remains fixed for all of the plurality of mask options, wherein for each of the plurality of mask options the first memory bank includes at least one but less than all of the plurality of memory arrays and the second memory bank includes a corresponding remainder of the plurality of memory arrays.

2. The integrated circuit memory of claim 1 wherein each of the plurality of mask options corresponds to a different partitioning of the memory arrays into the first and second memory banks.

3. The integrated circuit memory of claim 1 wherein memory operations can be carried out simultaneously in the first and second memory banks.

4. The integrated circuit memory of claim 1 wherein each of the memory arrays in the first and second memory banks has substantially the same number of memory cells.

5. The integrated circuit memory of claim 1 wherein each of the plurality of memory arrays includes a plurality of memory cells arranged along rows and columns, the integrated circuit memory further comprising:
column selection circuit coupled to select columns of cells in response to column addresses; and
row selection circuit coupled to select rows of cells in response to row addresses,
wherein each of the plurality of mask options configures the row and column selection circuits to obtain a different partitioning of the plurality of memory arrays into the first and second memory banks.

6. The integrated circuit memory of claim 5 wherein the row and column selection circuits respectively receive a first row address and a first column address for accessing one or more memory cells in the first memory bank, and the row and column selection circuits respectively receive a second row address and a second column address for accessing one or more memory cells in the second memory bank.

7. The integrated circuit memory of claim 1 wherein the integrated circuit memory receives a first bank address and a second bank address, the first bank address including row and column addresses for accessing one or more memory cells in the first memory bank, and the second bank address including row and column addresses for accessing one or more memory cells in the second memory bank.

8. The integrated circuit memory of claim 1 wherein the one of a plurality of mask options is used to form a metal layer in the integrated circuit.

9. An integrated circuit memory comprising:

a plurality of memory arrays each having memory cells arranged along rows and columns; and reconfigurable row and column selection circuits coupled to access memory cells in the plurality of memory arrays in response to row and column addresses, wherein one of a plurality of metal mask options is selected to configure the row and column selection circuits to obtain a desired partitioning of the plurality of memory arrays into first and second memory banks such that the first memory bank includes at least one but less than all of the plurality of memory arrays and the second memory bank includes a corresponding remainder of the plurality of memory arrays, and wherein memory operations can be carried out simultaneously in the first and second memory banks.

10. The integrated circuit memory of claim 9 wherein each of the plurality of metal mask options corresponds to a different partitioning of the memory arrays into the first and second memory banks.

11. The integrated circuit memory of claim 9 wherein the integrated circuit memory receives a first bank address and a second bank address, the first bank address including row and column addresses for accessing one or more memory cells in the first memory bank, and the second bank address including row and column addresses for accessing one or more memory cells in the second memory bank.

12. An integrated circuit memory comprising:

a plurality of memory arrays each having memory cells arranged along rows and columns; and reconfigurable row and column selection circuits coupled to access memory cells in the plurality of memory arrays in response to row and column addresses, wherein the plurality of memory arrays are partitioned, into first and second memory banks by configuring the row and column selection circuits into one of a plurality of mask-selectable configurations such that the first memory bank includes at least one but less than all of the plurality of memory arrays and the second memory bank includes a corresponding remainder of the plurality of memory arrays, wherein each of the mask-selectable configurations corresponds to one of a plurality of metal masks used to form a metal layer in the integrated circuit.

13. A method of configuring an integrated circuit memory having a plurality of memory arrays, the method comprising:

partitioning the plurality of memory arrays into first and second memory banks by selecting one of a plurality of mask options such that the length of a plurality of bit lines in each of the first and second memory banks remains fixed for all of the plurality of mask options, wherein for each of the plurality of mask options the first memory bank includes at least one but less than all of the plurality of memory arrays and the second memory bank includes a corresponding remainder of the plurality of memory arrays.

14. The method of claim 13 wherein each of the plurality of memory arrays includes a plurality of memory cells arranged along rows and columns, and the integrated circuit memory includes row and column selection circuits coupled to select memory cells in the plurality of memory arrays, wherein the plurality of memory arrays are partitioned into first and second memory banks by configuring the row and column selection circuits into one of a plurality of mask-selectable configurations, each of the mask-selectable configurations corresponding to one of the plurality of mask options.

15. The method of claim 13 wherein each of the plurality of mask options corresponds to a different partitioning of the memory arrays into the first and second memory banks.

16. The method of claim 13 wherein memory operations can be carried out simultaneously in the first and second memory banks.

17. A method of manufacturing an integrated circuit memory having row and column selection circuits coupled to a plurality of memory arrays, the method comprising:

applying one of a plurality of metal masks to form a metal layer and to configure the row and column select circuits to obtain a desired partitioning of the plurality of memory arrays into first and second memory banks such that the first memory bank includes at least one but less than all of the plurality of memory arrays and the second memory bank includes a corresponding remainder of the plurality of memory arrays, wherein each of the plurality of metal masks corresponds to a different configuration of the row and column selection circuits, and each of the different configurations of the row and column selection circuits correspond to a different partitioning of the plurality of memory arrays into the first and second memory banks.

* * * * *